(12) United States Patent
Wang et al.

(10) Patent No.: US 10,481,209 B2
(45) Date of Patent: Nov. 19, 2019

(54) METHOD FOR CHECKING A WIRE CONNECTION

(71) Applicant: CHROMA ATE INC., Taoyuan (TW)

(72) Inventors: Chih-Hsien Wang, Taoyuan (TW); Kun-Che He, Taoyuan (TW); Chung-Kuan Huang, Taoyuan (TW); Hong-Yu Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 76 days.

(21) Appl. No.: 15/854,955

(22) Filed: Dec. 27, 2017

(65) Prior Publication Data

US 2018/0180678 A1 Jun. 28, 2018

(30) Foreign Application Priority Data

Dec. 28, 2016 (TW) .............................. 105143738 A

(51) Int. Cl.
*G01R 31/36* (2019.01)
*G01R 31/04* (2006.01)

(52) U.S. Cl.
CPC ....... *G01R 31/3644* (2013.01); *G01R 31/041* (2013.01)

(58) Field of Classification Search
CPC ............................................................ G01R 31/382; G01R 31/392; G01R 31/3647; G01R 19/16542; G01R 19/00; G01R 19/0084; G01R 19/165; G01R 19/1659; G01R 19/2503; G01R 1/00; G01R 1/203; G01R 31/025; G01R 31/041; G01R 31/2837; G01R 31/3277; G01R 31/364; G01R 31/385; G01R 35/00; G01R 35/005; H01M 10/482; H01M 2010/4271; H01M 2010/4278; H01M 10/441; H01M 2/202; H01M 10/4285; H01M 10/63; H01M 10/4207; B60S 5/06; H03K 17/102; H03K 2217/0009; H03K 2217/0018

See application file for complete search history.

(56) References Cited

U.S. PATENT DOCUMENTS

| | | | |
|---|---|---|---|
| 9,147,875 B1 * | 9/2015 | Coakley ................. | H01M 2/202 |
| 2012/0139553 A1 * | 6/2012 | Nortman ................ | H02J 7/0016 324/537 |
| 2014/0306662 A1 * | 10/2014 | Kim ....................... | H02J 7/0016 320/118 |
| 2016/0091538 A1 * | 3/2016 | Ishihara ................. | G01R 35/04 324/108 |

* cited by examiner

*Primary Examiner* — Vinh P Nguyen
(74) *Attorney, Agent, or Firm* — Maschoff Brennan

(57) ABSTRACT

A method for checking a wire connection comprises providing a first current by a first power channel and measuring a first voltage by a first measuring channel when each of a positive terminal of the first measuring channel and a positive terminal of the first power channel is connected to one of positive terminals of batteries and each of a negative terminal of the first measuring channel and a negative terminal of the second measuring channel is connected to one of negative terminals of the batteries after measuring the first voltage, providing a second current by the first power channel and measuring a second voltage by the first measuring channel, and determining whether the first measuring channel and the first power channel are connected to a same battery of the batteries.

10 Claims, 5 Drawing Sheets

US 10,481,209 B2

METHOD FOR CHECKING A WIRE CONNECTION

CROSS-REFERENCE TO RELATED APPLICATIONS

This non-provisional application claims priority under 35 U.S.C. § 119(a) on Patent Application No(s). 105143738 filed in Taiwan, R.O.C. Dec. 28, 2016, the entire contents of which are hereby incorporated by reference.

BACKGROUND

Technical Field

This disclosure relates to a method for checking a wire connection, and more particularly to a method for checking a wire connection between a tester and batteries.

Related Art

Generally, a number of batteries are tested by a number of test units during a battery test. The more the quantity of the batteries is, the complex the wire connection between the batteries and the test units is, so that the wire connection can have an error easily. By a polarity detection, the positive/negative terminal of each channel of a testing unit can be confirmed whether to be connected to the positive/negative terminal of any one of batteries. However, the case that the power channel and the measuring channel of a testing unit are respectively connected to the different batteries must be detected through ways performed by a human operation or an additional detection rather than only the polarity detection. This kind of method for checking the wire connection results in costs of said additional equipment and more testing time.

SUMMARY

According to one or more embodiments of this disclosure, a method for checking a wire connection comprises providing a first current by a first power channel and measuring a first voltage by a first measuring channel when each of a positive terminal of the first measuring channel and a positive terminal of the first power channel is connected to one of positive terminals of batteries and each of a negative terminal of the first measuring channel and a negative terminal of the second measuring channel is connected to one of negative terminals of the batteries; after measuring the first voltage by the first measuring channel, providing a second current by the first power channel and measuring a second voltage by the first measuring channel; and determining whether the first measuring channel and the first power channel are connected to a same battery of the batteries.

According to one or more embodiments of this disclosure, a method for checking a wire connection further comprises measuring a plurality of third voltages respectively by a plurality of second measuring channels when the first current is provided by the first power channel; measuring a plurality of fourth voltages respectively by the plurality of second measuring channels when the second current is provided by the first power channel; and providing a correct wire connection according to a difference between each of the plurality of fourth voltages and a respective one of the plurality of third voltages when the first measuring channel and the first power channel are respectively connected to two different batteries of the batteries.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1B:
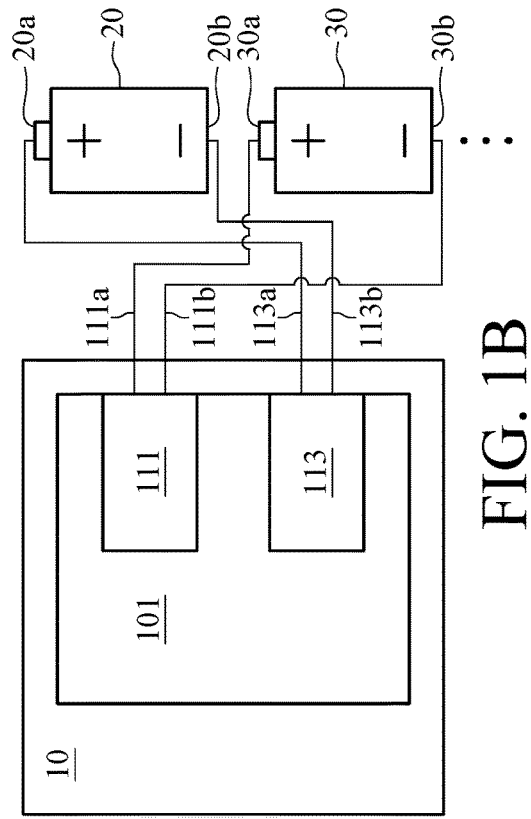
FIG. 1B is a schematic diagram of a wire connection of a tester applied to a method for checking the wire connection in another embodiment of this disclosure.
Figure 1A:
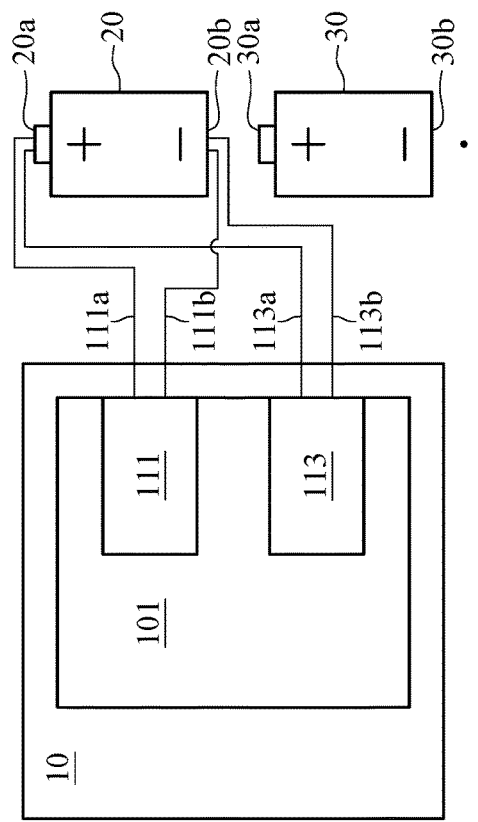
FIG. 1A is a schematic diagram of a wire connection of a tester applied to a method for checking the wire connection in an embodiment of this disclosure.

Please refer to FIG. 1A and FIG. 1B. FIG. 1A and FIG. 1B are schematic diagrams of wire connections of a tester applied to a method for checking the wire connection respectively in an embodiment and another embodiment of this disclosure. As shown in FIG. 1A and FIG. 1B, the tester 10 comprises a first test unit 101 with a first measuring channel 111 and a first power channel 113. The first measuring channel 111 comprises two terminals which are respectively a first measuring positive terminal 111a and a first measuring negative terminal 111b. The first power channel 113 also comprises two terminals which are respectively a first power positive terminal 113a and a first power negative terminal 113b. As shown in FIG. 1A, the first measuring positive terminal 111a as well as the first power positive terminal 113a is connected to the positive terminal 20a of a battery 20, the first measuring negative terminal 111b as well as the first power negative terminal 113b is connected to the negative terminal 20b of the battery 20. The first power channel 113 provides electrical power to the battery 20, and the first measuring channel 111 measures the current or voltage value of the battery 20 for test of the battery 20. The tester 10 can correctly execute the battery test through the wire connection shown in FIG. 1A. In other words, FIG. 1A is a schematic diagram of the correct wire connection. In contrast, FIG. 1B is a schematic diagram of an incorrect wire connection. As shown in FIG. 1B, the first measuring positive terminal 111a and the first measuring negative terminal 111b are respectively connected to the positive terminal 30a of another battery 30 and the negative terminal 30b of said another battery 30, but the first power positive terminal 113a and the first power negative terminal 113b are respectively connected to the positive terminal 20a of the battery 20 and the negative terminal 20b of the battery 20. It is an incorrect wire connection that the first measuring channel 111 and the first power channel 113 are respectively connected to the different batteries, and this incorrect wire connection can be detected by the method for checking the wire connection provided in this disclosure.

Figure 2:
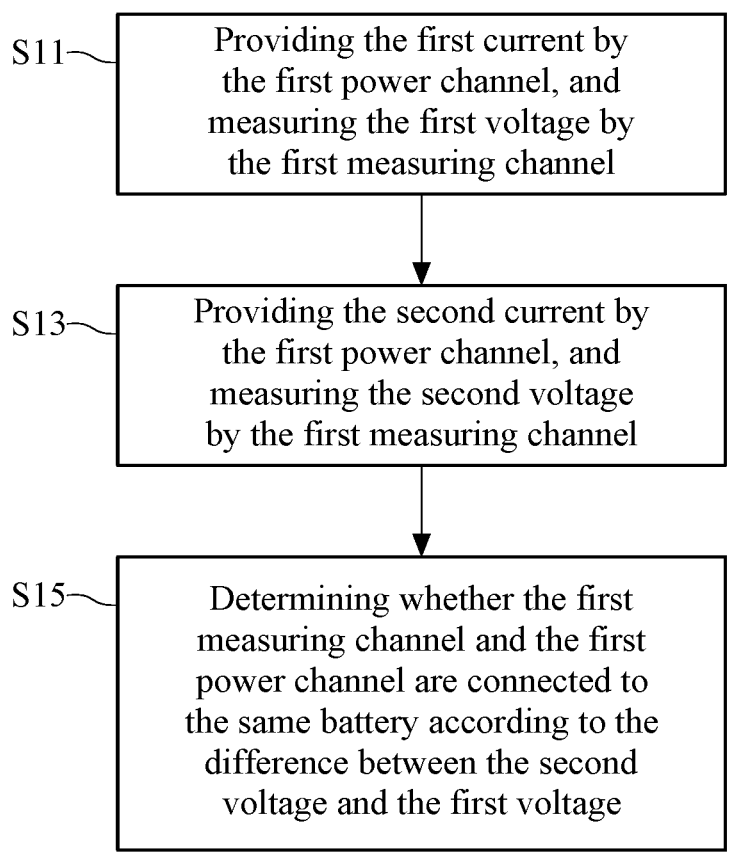
FIG. 2 is a flowchart of a method for checking a wire connection in an embodiment of this disclosure.

Please refer to FIG. 1A, FIG. 1B and FIG. 2. FIG. 2 is a flowchart of a method for checking a wire connection in an embodiment of this disclosure. In this embodiment, before the inspection of the wire connection is executed, the tester 10 determines whether each of a first measuring positive terminal 111a and a first power positive terminal 113a is connected to one of the positive terminals 20a and 30a of batteries 20 and 30, and whether each of a first measuring negative terminal 111b and a first power negative terminal 113b is connected to one of the negative terminals 20b and 30b of the batteries 20 and 30. As shown in FIG. 1A and FIG. 1B, each of the first measuring positive terminal 111a and the first power positive terminal 113a is connected to one of the positive terminals 20a and 30a of batteries 20 and 30, and each of the first measuring negative terminal 111b and the first power negative terminal 113b is connected to one of the negative terminals 20b and 30b of the batteries 20 and 30.

Figure 3:
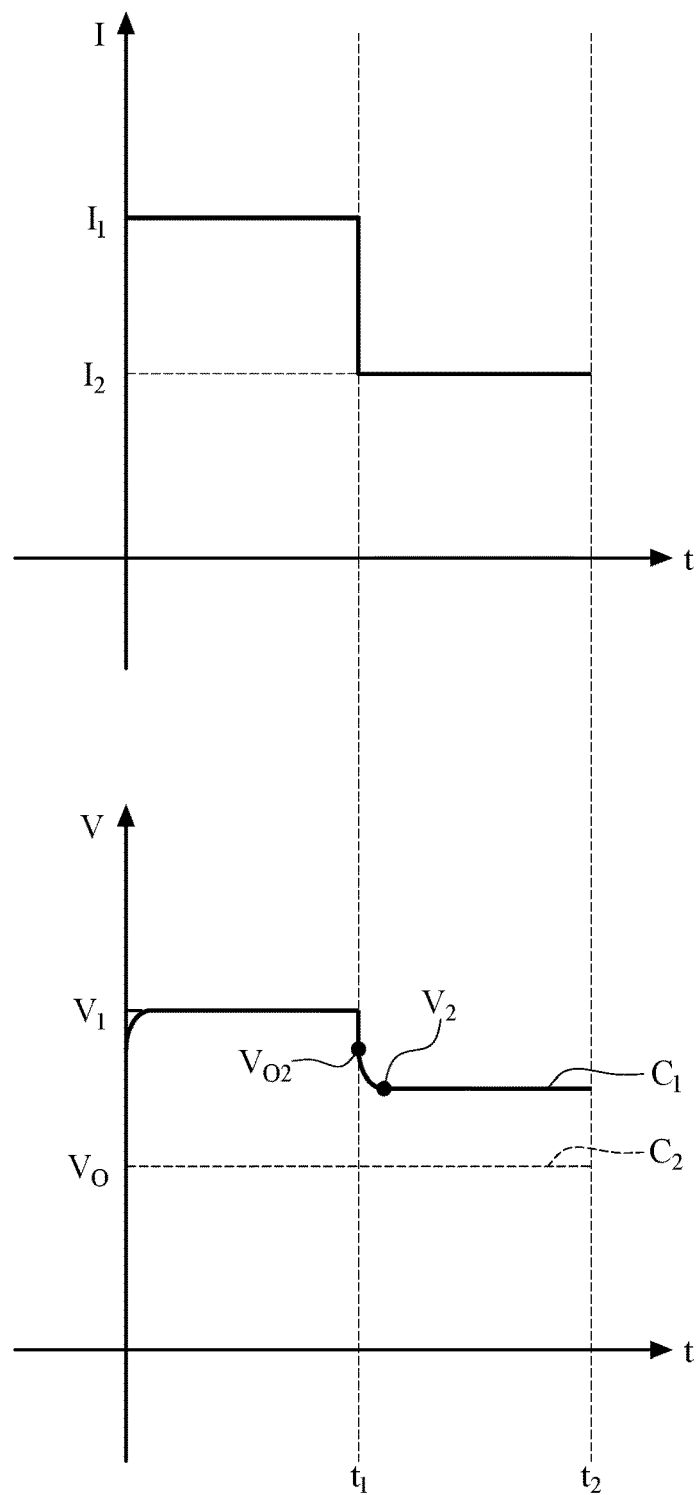
FIG. 3 includes current-time and voltage-time diagrams obtained when a method for checking a wire connection is executed respectively in the embodiments of FIG. 1A and FIG. 1B.

When the tester 10 determines that the positive terminals of all the channels are connected to the positive terminals of the batteries and the negative terminals of all the channels are connected to the negative terminals of the batteries, the first power channel 113 provides a first current and the first measuring channel 111 measures a first voltage in step S11. Please further refer to FIG. 3 which includes current-time and voltage-time diagrams obtained when a method for checking a wire connection is executed respectively in the embodiments of FIG. 1A and FIG. 1B. As shown in FIG. 3, the first curve $C_1$ indicates the voltage value measured by the first measuring channel 111 in the embodiment of FIG. 1A. In other words, the first curve $C_1$ is formed of the voltage value measured by the first measuring channel 111 when the first measuring channel 111 and the first power channel 113 are connected to the same battery. When the first power channel 113 provides the first current $I_1$ to the battery 20, the voltage value of the battery measured by the first measuring channel 111 increases from the initial voltage $V_o$ to the first voltage $V_1$. In contrast, the second curve $C_2$ indicates the voltage value measured by the first measuring channel 111 in the embodiment of FIG. 1B. In other words, the second curve $C_2$ is formed of the voltage value measured by the first measuring channel 111 when the first measuring channel 111 and the first power channel 113 are connected to the different batteries. When the first power channel 113 provides the first current $I_1$ to the battery 20, the measured voltage value remains the initial voltage $V_o$ because the first measuring channel 111 is not connected to the battery 20.

In step S13, the first power channel 113 provides the second current $I_2$ to the batteries 20, and the first measuring channel 111 measures the second voltage. In the case wherein the first measuring channel 111 and the first power channel 113 are connected to the same battery, the measured voltage value suddenly decreases to a transient voltage $V_{o2}$ and then gradually decreases to the balance voltage $V_2$ as shown by the first curve $C_1$ in FIG. 3. In an embodiment in the above case, the first measuring channel 111 measures the first voltage $V_1$ after the first power channel 113 provides the first current $I_1$ to the battery 20 for a first period $t_1$, and then the first measuring channel 111 starts to measure the second voltage after the first power channel 113 provides the second current $I_2$ to the battery 20 for a second period $t_2$, so that the balance voltage $V_2$ is obtained as the second voltage. In another embodiment, while the first power channel 113 provides the second current $I_2$, the first measuring channel 111 immediately starts to measure the second voltage, so that the transient voltage $V_{o2}$ is obtained as the second voltage. Therefore, the measuring method in this embodiment may not only measure the voltage variation but also has a shorter time for checking the wire connection. In another case wherein the first measuring channel 111 and the first power channel 113 are connected to the different batteries, when the current provided by the first power channel 113 changes from the first current $I_1$ to the second current $I_2$, the voltage value measured by the first measuring channel 111 still remains the initial voltage $V_o$ as shown by the first curve $C_2$ in FIG. 3.

In step S15, the tester 10 determines whether the wire connection of the first measuring channel 111 and the first power channel 113 is correct according to the difference between the second voltage and the first voltage, namely whether the first measuring channel 111 and the first power channel 113 are connected to the same battery. More specifically, the difference between the second voltage and the first voltage indicates the absolute difference of the second voltage and the first voltage. In an embodiment, when the difference between the second voltage and the first voltage is zero, the tester 10 determines that the first measuring channel 111 and the first power channel 113 are respectively connected to different batteries. More specifically, as shown in FIG. 1A, in the case wherein the first measuring channel 111 and the first power channel 113 are connected to the same batteries, when the current provided by the first power channel 113 changes, the first measuring channel 111 obtains the voltage variation at the same time. In other words, when the current provided by the first power channel 113 changes from the first current to the second current, the difference between the first voltage and the second voltage which are both measured by the first measuring channel 111 is not zero. In another embodiment, when the difference between the second voltage and the first voltage is less than a threshold, the tester 10 determines that the first measuring channel 111 and the first power channel 113 are respectively connected to different batteries. In practice, the first measuring channel 111 with the incorrect connection may obtain a noise voltage generated by a battery which is not provided with the current. Therefore, an invalid checking result due to the noise voltage may be avoided by setting the threshold for checking the wire connection. The value of the threshold can be designed according to the first current and the second current provided by the first power channel 113 and this disclosure does not intend to limit it.

In an embodiment, the first power channel 113 provides a fifth voltage to the battery 20 and the first measuring channel 111 measures a sixth voltage. The tester 10 then determines whether the first measuring channel 111 and the first power channel 113 are connected to the same battery according to the difference between the sixth voltage and the fifth voltage. More specifically, when the difference between the fifth voltage and the sixth voltage is larger than a threshold, the tester 10 determines that the first measuring channel 111 and the first power channel 113 are connected to the different batteries. The difference between the fifth voltage and the sixth voltage indicates the absolute difference of the sixth voltage and the fifth voltage. The threshold in this embodiment may be identical or not identical to the threshold in the previous embodiment. The value of the threshold in this embodiment can be designed according to the requirement of users and is not limited by this disclosure.

Figure 4:
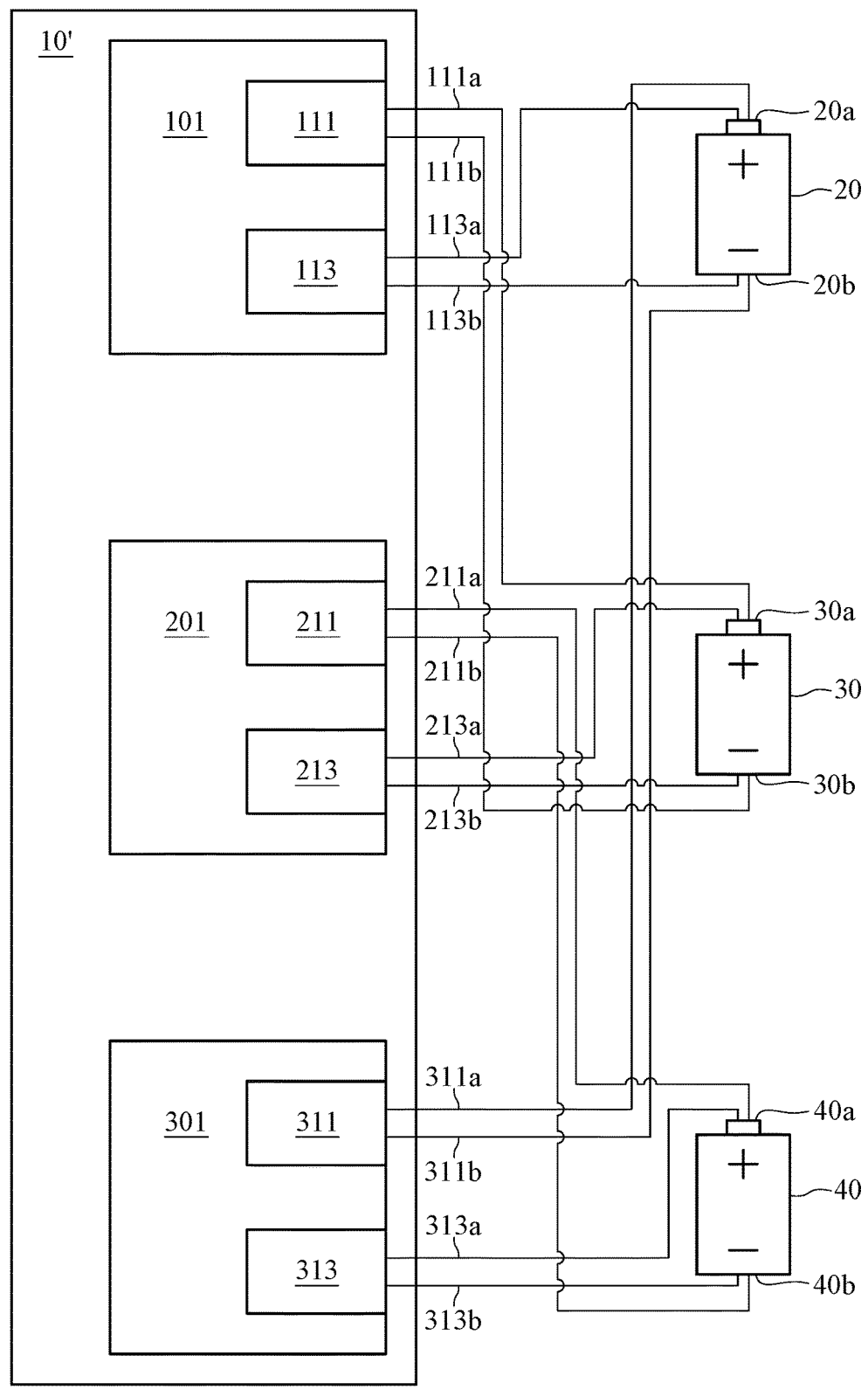
FIG. 4 is a schematic diagram of a wire connection of a tester applied to a method for checking the wire connection in yet another embodiment of this disclosure.

Please refer to FIG. 4 which is a schematic diagram of a wire connection of a tester applied to a method for checking the wire connection in yet another embodiment of this disclosure. In this embodiment, tester comprises a first testing unit and a plurality of second testing unit. In order to simplify the description, an example wherein a tester comprises two second testing units is explained as follows, and the number of the second testing units included in a tester is not limited to it. As shown in FIG. 4, the tester 10' comprises a first testing unit 101 and two second testing units 201 and 301. The first testing unit 101 comprises the first measuring channel 111 and the first power channel 113. The second testing units 201 and 301 respectively comprise the second measuring channels 211 and 311 and the second power channels 213 and 313. Each of the measuring channels and power channels comprises two terminals which are the positive terminal and the negative terminal. For instance, the first measuring channel 111 comprises the first measuring positive terminal 111a and the first measuring negative terminal 111b.

In an embodiment, before executing the inspection of the wire connection, the tester 10' determines whether all the first measuring positive terminal 111a, the first power positive terminal 113a, the second measuring positive terminals 211a and 311a, and the second measuring positive terminals 213a and 313a are respectively connected to any one of the positive terminals 20a-40a of batteries 20-40, and the tester 10' also determines whether all the first measuring negative terminal 111b, the first power negative terminal 113b, the second measuring negative terminals 211b and 311b, and the second measuring negative terminals 213b and 313b are respectively connected to any one of the negative terminals 20b-40b of the batteries 20-40. Furthermore, the tester 10' determines whether each of the positive terminals 20a-40a is at most connected with one measuring positive terminal and one power positive terminal, and whether each of the negative terminals 20b-40b is at most connected with one measuring negative terminal and one power negative terminal. When the above conditions are complied with, the tester 10' executes the inspection of the wire connection. In other words, before executing the inspection of the wire connection, the tester 10' verifies that the positive terminal of each of the channels is connected to the positive terminal of any one of the batteries, the negative terminal of each of the channels is connected to the negative terminal of any one of the batteries, and each terminal of each of the batteries is connected to one measuring channel and one power channel at most.

Figure 5:
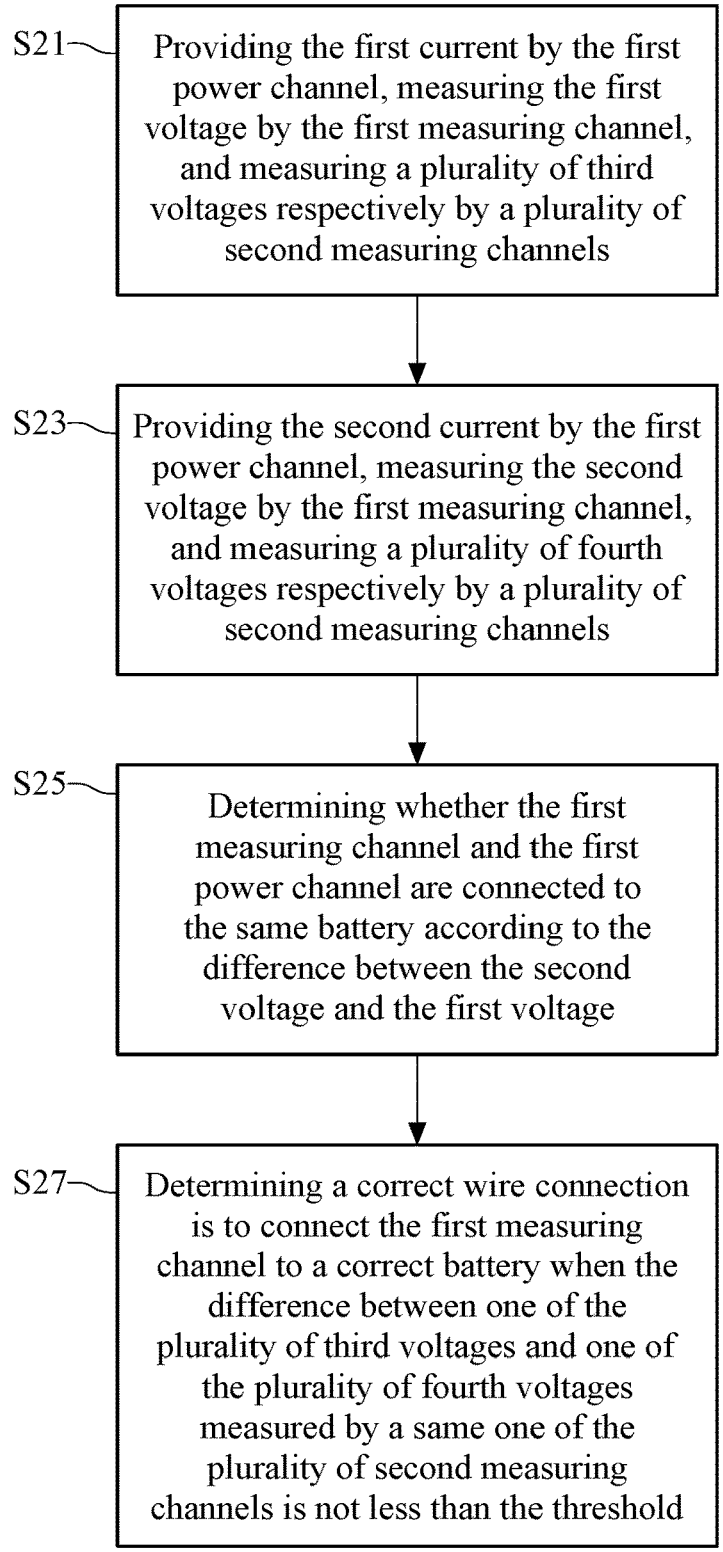
FIG. 5 is a flowchart of a method for checking a wire connection in another embodiment of this disclosure.

Please refer to FIG. 4 and FIG. 5. FIG. 5 is a flowchart of a method for checking a wire connection in the embodiment as shown in FIG. 4. In step S21, the first power channel 113 provides the first current, the first measuring channel 111 measures the voltage which is considered to be the first voltage, and the second measuring channels 211 and 311 respectively measure the voltages which are considered to be third voltages. In step S23, the first power channel 113 provides the second current, the first measuring channel 111 measures the voltage which is considered to be the second voltage, and the second measuring channels 211 and 311 respectively measure the voltages which are considered to be the fourth voltages. In other words, when the tester 10' executes the inspection of the wire connection of the first testing unit 101, the first power channel 113 of the first testing unit 101 provides different currents in sequence and the first measuring channel 111 of the first testing unit 101 as well as the second measuring channels 211 and 311 of the second testing units 201 and 301 measure the voltages respectively relative to the different currents. In an embodiment, after the first power channel 113 provides the first current to the battery 20 for a first period, the first measuring channel 111 starts to measure the first voltage, and the second measuring channels 211 and 311 respectively start to measure the third voltages. Afterwards, the first power channel 113 further provides the second current to the battery 20, and after a second period, the first measuring channel 111 starts to measure the second voltages, and the second measuring channels 211 and 311 respectively start to measure the fourth voltages. In another embodiment, while the first power channel 113 provides the second current, the first measuring channel 111 and the second measuring channels 211 and 311 immediately and respectively start to measure the second voltage and the fourth voltages. Therefore, the measuring method in this embodiment may not only measure the voltage variation but also has a shorter time for checking the wire connection. The relationship between the provided current and the measured voltage is described in the above embodiment of FIG. 3 so the related details are not repeated herein.

In step S25 which is similar to the step S15 of the method for checking the wire connection in the aforementioned embodiment of FIG. 2, the tester 10' determines whether the first measuring channel 111 and the first power channel 113 are connected to the same battery according to the difference between the second voltage and the first voltage. In an embodiment, when the difference between the second voltage and the first voltage is zero, the tester 10' determines the first measuring channel 111 and the first power channel 113 are connected to the different batteries. In another embodiment, when the difference between the second voltage and the first voltage is smaller than a threshold, the tester 10' determines the first measuring channel 111 and the first power channel 113 are connected to the different batteries. The specific determination rules are explained in the aforementioned embodiment which is related to the method for checking the wire connection of FIG. 2, so that these rules are not repeated herein.

In step S27, when the first measuring channel 111 and the first power channel 113 are determined to be connected to different batteries, the tester 10' provides a correct wire connection to an user according to the differences respectively between the third voltages and the fourth voltages measured by the second measuring channels 211 and 311, so that the user may connect the first measuring channel 111 and the first power channel 113 to the same batteries. The difference between the fourth voltage and the third voltage indicates the absolute difference of the fourth voltage and the third voltage. Moreover, the correct wire connection can be displayed on a screen, or be notified by voice or another method, which is not limited to the above. In an embodiment, when the difference between the second voltage and the first voltage which are measured by the first measuring channel 111, and the difference between the fourth voltage and the third voltage which are measured by the second measuring channel 211 or 311 is not zero, the tester 10' determines that the first measuring channel 111 has to be connected to the battery which is connected to the second measuring channel obtaining the fourth voltage and the third voltage having the difference therebetween. In practice, as shown in FIG. 4, when the first power channel 113 provides the first current and then provides the second current to the battery 20, the first measuring channel 111 does not obtain any voltage variation because the first measuring channel 111 is connected to the battery 30, but the second measuring channel 311 connected to the battery 30 obtains the voltage variation. Therefore, the tester 10' determines that the first measuring channel 111 and the first power channel 113 of the first testing unit 101 are connected to different batteries, and the wires originally connected to the terminals 311a and 311b of the second measuring channel 311 have to be connected to the first measuring channel 111. In another embodiment, when the difference between the second voltage and the first voltage measured by the first measuring channel 111 is less than a threshold and the difference between the fourth voltage and the third voltage measured by one of the second measuring channels 211 and 311 is not less than the threshold, the tester 10' determines that the correct wire connection is to connect the first measuring channel 111 to a correct battery, with said one of the second measuring channels 211 and 311 obtaining said difference not less than the threshold from said correct battery. Therefore, an invalid checking result due to the noise voltage may be avoided by setting the threshold for checking the wire connection.

In the aforementioned embodiments, the first testing unit is regarded as a testing unit for powering and measuring, and the second testing unit is regarded as a testing unit merely for measuring. In practice, testing units executes the aforementioned method for checking the wire connection one by one in order to determine whether the wire connection of every testing unit is correct (i.e. whether the measuring channel and the power channel of every testing unit are connected to the same battery).

In view of the above description, the method for checking a wire connection in this disclosure provides two different currents to a battery by the power channel of a tester in sequence, measures the voltage variation by the measuring channel of the tester, and determines whether the wire connection is correct according to the voltage variation. When the measuring channel and the power channel are determined to be connected to the different batteries, a correct wire connection is further provided. Therefore, the testing time cost by manual inspection and the additional equipment cost for checking the wire connection may be reduced.

What is claimed is:

1. A method for checking a wire connection, comprising:
   providing a first current to one of batteries by a first power channel and measuring a first voltage by a first measuring channel when the first power channel is connected to said one of the batteries and the first measuring channel is connected to said one or another one of the batteries,
   after measuring the first voltage by the first measuring channel, providing a second current to said one of the batteries by the first power channel and measuring a second voltage by the first measuring channel; and
   determining whether the first measuring channel and the first power channel are connected to a same battery of the batteries according to a difference between the second voltage and the first voltage,
   wherein the first and second current have different values.

2. The method according to claim 1, wherein providing the first current by the first power channel and measuring the first voltage by the first measuring channel further comprises:
   starting to measure the first voltage by the first measuring channel after providing the first current by the first power channel for a first period; and
   wherein providing the second current by the first power channel and measuring the second voltage by the first measuring channel comprises:
   starting to measure the second voltage by the first measuring channel after providing the second current by the first power channel for a second period.

3. The method according to claim 1, wherein providing the first current by the first power channel and measuring the first voltage by the first measuring channel further comprises:
   starting to measure the first voltage by the first measuring channel after providing the first current by the first power channel for a first period; and
   wherein providing the second current by the first power channel and measuring the second voltage by the first measuring channel comprises:
   immediately starting to measure the second voltage by the first measuring channel while providing the second current by the first power channel.

4. The method according to claim 1, further comprising:
   determining the first measuring channel and the first power channel are respectively connected to two different batteries of the batteries when the difference between the second voltage and the first voltage is less than a threshold.

5. The method according to claim 4, further comprising:
   measuring a plurality of third voltages respectively by a plurality of second measuring channels when the first current is provided by the first power channel;
   measuring a plurality of fourth voltages respectively by the plurality of second measuring channels when the second current is provided by the first power channel; and
   providing a correct wire connection according to a difference between each of the plurality of fourth voltages and a respective one of the plurality of third voltages when the first measuring channel and the first power channel are respectively connected to two different batteries of the batteries.

6. The method according to claim 5, wherein the plurality of second measuring channel starts to measure the plurality of third voltages respectively after the first power channel provides the first current for a first period, and immediately starts to measure the plurality of fourth voltages respectively while the first power channel provides the second current.

7. The method according to claim 5, further comprising when the difference between one of the plurality of third voltages and one of the plurality of fourth voltages measured by a same one of the plurality of second measuring channels is not less than the threshold, determining the correct wire connection is to connect the first measuring channel to a correct battery, with said one of the plurality of second measuring channels obtaining said difference not less than the threshold from said correct battery.

8. The method according to claim 4, further comprising:
   providing a fifth voltage by the first power channel and measuring a sixth voltage by the first measuring channel; and
   determining whether the first measuring channel and the first power channel are connected to a same battery of the batteries according to a difference between the sixth voltage and the fifth voltage.

9. The method according to claim 8, further comprising:
   determining the first measuring channel and the first power channel are respectively connected to two different batteries of the batteries when the difference between the fifth voltage and the sixth voltage is larger than the threshold.

10. The method according to claim 5, wherein the plurality of second measuring channel starts to measure the plurality of third voltages respectively after the first power channel provides the first current for a first period, and starts to measure the plurality of fourth voltages respectively after the first power channel provides the second current for a second period.

\* \* \* \* \*